US012700578B2

(12) United States Patent
Shaw et al.

(10) Patent No.: US 12,700,578 B2
(45) Date of Patent: Aug. 4, 2026

(54) PLASMA PROCESSING BASED ON BIAS SUPPLY REPORTING

(71) Applicant: Advanced Energy Industries, Inc., Denver, CO (US)

(72) Inventors: Denis Shaw, Fort Collins, CO (US); Daniel Carter, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

(21) Appl. No.: 18/946,058

(22) Filed: Nov. 13, 2024

(65) Prior Publication Data

US 2025/0279268 A1     Sep. 4, 2025

Related U.S. Application Data

(63) Continuation-in-part of application No. 18/591,261, filed on Feb. 29, 2024.

(51) Int. Cl.
H01J 37/32 (2006.01)

(52) U.S. Cl.
CPC .... H01J 37/3299 (2013.01); H01J 37/32128 (2013.01); H01J 37/32183 (2013.01); H01J 37/32697 (2013.01); *H01J 2237/3321* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,705,931 | A | 1/1998 | Klick |
| 6,041,734 | A | 3/2000 | Raoux et al. |
| 6,333,738 | B1 | 12/2001 | Ide |
| 7,038,399 | B2 | 5/2006 | Lys et al. |
| 7,050,022 | B2 | 5/2006 | Kigo et al. |
| 7,144,131 | B2 | 12/2006 | Rains |
| 7,145,125 | B2 | 12/2006 | May et al. |
| 7,352,138 | B2 | 4/2008 | Lys et al. |
| 7,768,477 | B2 | 8/2010 | Jung et al. |
| 8,329,054 | B2 | 12/2012 | Ichino et al. |
| 8,675,378 | B2 | 3/2014 | Beland |
| 9,226,380 | B2 | 12/2015 | Finley |
| 9,275,836 | B2 | 3/2016 | Himori |
| 9,667,211 | B1 | 5/2017 | Wyse et al. |

(Continued)

FOREIGN PATENT DOCUMENTS

| | | |
|---|---|---|
| CN | 206272512 U | 6/2017 |
| DE | 19912981 C1 | 12/2000 |

(Continued)

OTHER PUBLICATIONS

Diop et al., 10 kV SiC MOSFET Evaluation for Dielectric Barrier Discharge Transformerless Power Supply, Aug. 18, 2020, Plasma, vol. 3, No. 3, pp. 103-116.

(Continued)

*Primary Examiner* — Kenneth B Wells
(74) *Attorney, Agent, or Firm* — NOD Law PC

(57) ABSTRACT

A generator to provide a source waveform, and a controller configured to receive a signal indicative of power reflected to the generator, receive timing information from a bias supply, and provide a report of the impedance based upon the bias waveform information.

20 Claims, 13 Drawing Sheets

(56) References Cited

U.S. PATENT DOCUMENTS

| | | | |
|---|---|---|---|
| 10,355,582 | B2 | 7/2019 | Braginsky et al. |
| 10,607,813 | B2 * | 3/2020 | Fairbairn ............ C23C 16/4586 |
| 11,437,221 | B2 | 9/2022 | Carter et al. |
| 11,569,066 | B2 | 1/2023 | Cubaynes et al. |
| 11,615,941 | B2 | 3/2023 | Brouk et al. |
| 11,670,487 | B1 | 6/2023 | Nguyen |
| 11,875,972 | B2 | 1/2024 | Driessen |
| 11,887,812 | B2 | 1/2024 | Nguyen et al. |
| 11,942,309 | B2 | 3/2024 | Singh |
| 11,978,613 | B2 | 5/2024 | Nguyen |
| 12,009,179 | B2 | 6/2024 | Nguyen |
| 12,034,405 | B2 | 7/2024 | Yamamoto |
| 12,046,448 | B2 | 7/2024 | Singh et al. |
| 12,125,674 | B2 | 10/2024 | Carter |
| 12,294,212 | B2 | 5/2025 | Alskran et al. |
| 2006/0221000 | A1 | 10/2006 | Moon |
| 2010/0244802 | A1 | 9/2010 | Alexander |
| 2010/0276273 | A1 | 11/2010 | Heckman et al. |
| 2011/0038187 | A1 | 2/2011 | Horishita et al. |
| 2011/0065161 | A1 | 3/2011 | Kwasinski et al. |
| 2011/0286580 | A1 | 11/2011 | Beland |
| 2012/0217221 | A1 | 8/2012 | Hoffman et al. |
| 2012/0235976 | A1 | 9/2012 | Van Lier |
| 2012/0318456 | A1 | 12/2012 | Brouk et al. |
| 2013/0083566 | A1 | 4/2013 | Gaknoki et al. |
| 2013/0327272 | A1 | 12/2013 | Augustyniak et al. |
| 2014/0061156 | A1 | 3/2014 | Brouk et al. |
| 2014/0062303 | A1 | 3/2014 | Hoffman et al. |
| 2014/0062495 | A1 | 3/2014 | Carter et al. |
| 2014/0117872 | A1 | 5/2014 | Finley |
| 2015/0222181 | A1 | 8/2015 | Coleman |
| 2015/0250046 | A1 | 9/2015 | Habu |
| 2015/0348763 | A1 | 12/2015 | Mori et al. |
| 2017/0256381 | A1 | 9/2017 | Denpoh |
| 2017/0345620 | A1 | 11/2017 | Coumou et al. |
| 2018/0005802 | A1 | 1/2018 | Chen et al. |
| 2018/0233321 | A1 | 8/2018 | Caron |
| 2018/0287484 | A1 | 10/2018 | Braginsky et al. |
| 2018/0342903 | A1 | 11/2018 | Luu et al. |
| 2019/0035606 | A1 | 1/2019 | Yoo et al. |
| 2019/0131110 | A1 | 5/2019 | Ziemba et al. |
| 2019/0157040 | A1 | 5/2019 | Fairbairn et al. |
| 2019/0157043 | A1 | 5/2019 | Shaw et al. |
| 2019/0180982 | A1 | 6/2019 | Brouk et al. |
| 2019/0273496 | A1 | 9/2019 | van Zyl |
| 2019/0316249 | A1 | 10/2019 | Abraham et al. |
| 2020/0020510 | A1 | 1/2020 | Shoeb et al. |
| 2020/0090905 | A1 | 3/2020 | Brouk et al. |
| 2020/0111644 | A1 | 4/2020 | Long et al. |
| 2020/0135527 | A1 | 4/2020 | Sung et al. |
| 2020/0266036 | A1 | 8/2020 | Aoki et al. |
| 2020/0313567 | A1 | 10/2020 | Porter et al. |
| 2020/0357607 | A1 | 11/2020 | Ziemba et al. |
| 2020/0357658 | A1 | 11/2020 | Nagami et al. |
| 2021/0013006 | A1 | 1/2021 | Nguyen et al. |
| 2021/0091767 | A1 | 3/2021 | Cairoli et al. |
| 2021/0118649 | A1 | 4/2021 | Huh et al. |
| 2021/0335579 | A1 | 10/2021 | Jang |
| 2021/0351007 | A1 | 11/2021 | Carter |
| 2022/0037121 | A1 | 2/2022 | Dorf et al. |
| 2022/0037122 | A1 | 2/2022 | Bowman et al. |
| 2022/0070984 | A1 | 3/2022 | Van et al. |
| 2022/0116033 | A1 | 4/2022 | Miller et al. |
| 2022/0254610 | A1 | 8/2022 | Bhutta |
| 2022/0270856 | A1 | 8/2022 | Poulose et al. |
| 2022/0384149 | A1 | 12/2022 | Shi et al. |
| 2022/0393589 | A1 | 12/2022 | Maksimovic et al. |
| 2022/0415615 | A1 | 12/2022 | Cubaynes et al. |
| 2023/0050119 | A1 | 2/2023 | Martinez et al. |
| 2023/0050841 | A1 | 2/2023 | Nguyen |
| 2023/0064671 | A1 | 3/2023 | Alskran et al. |
| 2023/0207264 | A1 | 6/2023 | Hasegawa |
| 2023/0253183 | A1 | 8/2023 | Mavretic et al. |
| 2023/0253187 | A1 | 8/2023 | Kumar |
| 2023/0268162 | A1 * | 8/2023 | Van Zyl ............ H01J 37/32357 156/345.28 |
| 2023/0343556 | A1 | 10/2023 | Nguyen |
| 2023/0395354 | A1 | 12/2023 | Shaw et al. |
| 2024/0030001 | A1 | 1/2024 | Nguyen et al. |
| 2024/0055227 | A1 | 2/2024 | Ziemba et al. |
| 2024/0079210 | A1 | 3/2024 | Nguyen |
| 2024/0154404 | A1 | 5/2024 | Alskran et al. |
| 2024/0194452 | A1 | 6/2024 | Singh |
| 2024/0242945 | A1 | 7/2024 | Nguyen et al. |
| 2024/0282553 | A1 | 8/2024 | Zhang |
| 2024/0304419 | A1 | 9/2024 | Nguyen |
| 2024/0348225 | A1 | 10/2024 | Suh et al. |
| 2024/0355585 | A1 * | 10/2024 | Burry ................ H01J 37/32174 |
| 2024/0404788 | A1 * | 12/2024 | Luu ................... H01J 37/32146 |
| 2025/0166965 | A1 | 5/2025 | Carter |
| 2025/0174436 | A1 * | 5/2025 | Radomski ......... H01J 37/32155 |
| 2025/0253133 | A1 | 8/2025 | Ziemba et al. |
| 2025/0259822 | A1 | 8/2025 | Ziemba et al. |

FOREIGN PATENT DOCUMENTS

| | | |
|---|---|---|
| JP | 4016325 B2 | 12/2007 |
| JP | 2019-523993 A | 8/2019 |
| JP | 2021-503701 A | 2/2021 |
| JP | 7736714 B2 | 9/2025 |
| KR | 1020110016486 A | 2/2011 |
| TW | 201009879 A | 3/2010 |
| TW | 201116166 A | 5/2011 |
| TW | 201243812 A | 11/2012 |
| WO | 2010008006 A1 | 1/2010 |

OTHER PUBLICATIONS

EPO, Extended European Search Report issued in EP Application No. 22856600.6, May 12, 2025, 9 pages.

KIPO, Notice of Grounds for Rejection issued in KR Application No. 10-2022-7042658, Jul. 10, 2025, 26 pages.

Rueda et al., Series Resonant Inverter Efficiency Improvement with Valley Switching for Dielectric Barrier Discharges, IEEE 2019 IEEE 13th International Conference Onpower Electronics and Drive Systems, Toulouse, France, Jul. 9-12, 2019, 6 pages.

Skibinski, Tomi Sweet, Office Action issued U.S. Appl. No. 18/656,543, May 15, 2025, 33 pages.

Ferdous, Zannatul, Office action issued in U.S. Appl. No. 18/350,516, Mar. 20, 2025, 133 pages.

KIPO, Notice of Grounds for Rejection issued in Korean Patent Application No. 10-2022-7004812, Mar. 12, 2025, 15 pages.

PCT, International Preliminary Report on Patentability issued in PCT/US2023/073153, Mar. 13, 2025, 9 pages.

EPO, Extended European Search Report issued in Application No. 21803110.2, Jun. 6, 2024, pp. 11.

Japan Patent Office, Notice of Reasons for Rejection issued in JP Application No. 2022-568414, Oct. 10, 2024,.

JPO, Notice of Reasons for Rejection issued in Application No. 2022-501232, May 29, 2024, 10 pages, Published in JP.

Lee, Jye-June, Office Action issued in U.S. Appl. No. 18/742,088, Jan. 16, 2025, 36 pages.

PCT, International Preliminary Report on Patentability issued in PCT/US2022/053703, Aug. 8, 2024, 7 pages.

PCT, International Preliminary Report on Patentability issued in PCT/US2022/053706, Aug. 8, 2024, 8 pages.

PCT, International Preliminary Report on Patentability issued in PCT/US2022/053709, Aug. 8, 2024, 7 pages.

PCT, International Search Report and Written Opinion issued in PCT/US2024/011334, Jun. 21, 2024, 16 pages.

PCT, International Search Report and Written Opinion issued in PCT/US2024/035494, Sep. 19, 2024, 14 pages.

PCT, International Search Report and Written Opinion issued in PCT/US2024/055362, Jan. 14, 2025, 18 pages, Published in: US.

PCT, International Search Report and Written Opinion issued PCT/US2023/073153, Feb. 9, 2024, 18 pages.

Skibinski, Tomi Sweet, Non-final Office Action issued in U.S. Appl. No. 18/656,543, Nov. 15, 2024, 21 pages.

(56) References Cited

OTHER PUBLICATIONS

TIPO, Office Action issued in TW Application No. 109123604, Jun. 24, 2024, 26 pages, Published in TW.

Yu, Yuechuan, Final Office Action issued in U.S. Appl. No. 18/318,861, Nov. 12, 2024, 95 pages.

Yu, Yuechuan, Non-final office action issued in U.S. Appl. No. 18/318,861, Mar. 20, 2024, 51 pages.

Final Office Action received for U.S. Appl. No. 18/350,516, mailed on Aug. 7, 2025, 29 pages.

Final Office Action received for U.S. Appl. No. 18/670,168 dated Sep. 11, 2025, 6 pages.

International Preliminary Report on Patentability received for PCT Patent Application No. PCT/US2024/011334, mailed on Jul. 24, 2025, 7 pages.

International Search Report and Written Opinion received for PCT Patent Application No. PCT/US2025/040171, mailed on Oct. 8, 2025, 17 pages.

Non-Final Office Action received for U.S. Appl. No. 18/518,840 mailed on Sep. 23, 2025, 9 pages.

Non-Final Office Action received for U.S. Appl. No. 18/670,168 dated Aug. 29, 2025, 5 pages.

Notice of Allowance received for JP Patent Application Serial No. 2022-568414, dated Jul. 29, 2025, 4 pages.

Office Action received for European Application No. 24742051.6, mailed on Aug. 20, 2025, 3 pages.

Office Action received for Japanse Patent Application No. 2024-215046, mailed on Jun. 26, 2025, 3 pages (2 pages of original office action and 1 page of English Translation).

Yu, Yuechuan, Office Action issued in U.S. Appl. No. 18/318,861, Feb. 20, 2025, 102 pages.

Ford, Nathan K, Office Action issued in U.S. Appl. No. 17/401,422, Apr. 24, 2025, 100 pages.

PCT, International Search Report and Written Opinion issued in PCT/US2025/017119, Apr. 29, 2025, 20 pages.

International Search Report and Written Opinion received for PCT Patent Application No. PCT/US2025/055206, mailed on Feb. 3, 2026, 20 pages.

Office Action received for Taiwanese Patent Application No. 114119273, mailed on Jan. 8, 2026, 20 pages (10 pages of English Translation and 10 pages of Original Document).

Final Office Action received for U.S. Appl. No. 17/401,422, mailed on Dec. 3, 2025, 7 pages.

Non-Final Office Action received for U.S. Appl. No. 18/794,876, mailed on Dec. 17, 2025, 17 pages.

Notice of Allowance received for U.S. Appl. No. 18/350,516, mailed on Jan. 16, 2026, 9 pages.

Notice of Allowance received for U.S. Appl. No. 18/656,543, mailed on Dec. 19, 2025, 9 pages.

Notice of Allowance received for U.S. Appl. No. 18/670,168, mailed on Nov. 25, 2025, 7 pages.

Requirement for Restriction/Election received for U.S. Appl. No. 18/096,478, mailed on Dec. 10, 2025, 6 pages.

Final Office Action received for U.S. Appl. No. 18/518,840, mailed on Apr. 3, 2026, 11 pages.

MOIP, Notice of Grounds for Rejection issued in Korean Patent Application No. 10-2024-7008015, on Feb. 24, 2026, 13 pages.

Non-Final Office Action received for U.S. Appl. No. 17/401,422, mailed on May 5, 2026, 8 pages.

Non-Final Office Action received for U.S. Appl. No. 18/096,478, mailed on Apr. 2, 2026, 21 pages.

Non-Final Office Action received for U.S. Appl. No. 18/591,261, mailed on May 7, 2026, 13 pages.

Non-Final Office Action received for U.S. Appl. No. 18/670,168, mailed on Apr. 1, 2026, 13 pages.

Non-Final Office Action received for U.S. Appl. No. 18/830,709, mailed on May 1, 2026, 10 pages.

Office Action received for Korean Patent Application No. 10-2024-7008015 , mailed on Feb. 24, 2026, 13 pages (7 pages of original office action and 6 pages of English Translation).

Office Action received for Malaysia Patent Application No. PI2022006188, mailed on Oct. 3, 2025, 4 pages.

Office Action received for Taiwanese Patent Application No. 111130474, mailed on Apr. 13, 2026, 20 pages (9 pages of English Translation and 11 pages of Original Document).

Requirement for Restriction/Election received for U.S. Appl. No. 18/584,816, mailed on May 13, 2026, 8 pages.

\* cited by examiner

Apply a waveform to a first node, wherein the waveform includes a peak voltage and a ramp voltage    ~402

Receive an impedance indicator of a load coupled to the first node    ~404

Control the ramp voltage based on the impedance indicator    ~406

PLASMA PROCESSING BASED ON BIAS SUPPLY REPORTING

CLAIM OF PRIORITY UNDER 35 U.S.C. § 120

The present Application for Patent is a Continuation-in-Part of U.S. patent application Ser. No. 18/591,261 entitled "PLASMA PROCESSING BIAS CONTROL BASED ON IMPEDANCE" filed Feb. 29, 2024 which is assigned to the assignee hereof and hereby expressly incorporated by reference herein.

BACKGROUND

Field of the Disclosure

The present disclosure relates generally to plasma processing. More specifically, but without limitation, the present disclosure relates to power supplies used during plasma processing.

Background

Plasma processing is a versatile technology used in semiconductor manufacturing, enabling precise control over material removal, deposition, and surface modification to fabricate advanced electronic devices. For some types of plasma processing, such as plasma etching, two types of power are applied to a plasma chamber: source power and bias power. Source power generates and sustains the plasma within the chamber. Bias power regulates the energy of plasma ions bombarding the substrate (e.g., silicon wafer) to control material removal.

It is often desirable to control the source power to reduce reflected power from the plasma chamber, and a match network may be utilized to improve impedance matching between a generator providing the source power and the plasma chamber. In addition, the generator may adjust its frequency to improve impedance matching between the generator and the plasma chamber.

In certain applications, bias power helps minimize charging effects on the substrate. Charging can occur when ions accumulate on the surface of the substrate, altering the potential difference between the substrate and plasma, and influencing ion trajectories in unpredictable ways. By neutralizing this charge, bias power contributes to maintaining accurate and consistent etching profiles on the substrate. However, current techniques for controlling bias power rely on assumptions or predictions of the capacitances present in the plasma chamber which can be inaccurate.

SUMMARY

An aspect may be characterized as a system comprising a generator to provide a first waveform and a controller configured to receive a signal indicative of power reflected to the generator, receive timing information from a bias supply, and provide a report indicative of power reflected to the generator based upon the timing information.

Another aspect may be characterized as a system comprising a bias supply configured to apply a bias waveform comprising a peak voltage and a ramp voltage, a generator to apply a first waveform, and at least one controller. The at least one controller is configured to: receive an impedance indicator indicative of an impedance coupled to the generator; receive timing information from the bias supply; and control the generator to provide a report of the impedance that is based upon the timing information.

Yet another aspect may be characterized as a non-transient computer-readable storage medium comprising instructions embodied thereon, wherein the instructions are executable by a processor and/or capable of programming a field programmable gate array, the instructions comprising instructions for: providing a bias waveform with a bias supply, wherein the bias waveform includes a peak voltage and a ramp voltage, applying radio frequency power with a source generator, receiving a signal indicative of power reflected to the source generator, receiving timing information from the bias supply, obtaining, using the timing information, a measure of the power reflected to the source generator while the ramp voltage is occurring, and controlling the radio frequency power based upon the measure of the power reflected to the source generator while the ramp voltage is occurring.

DETAILED DESCRIPTION

The following modes, features or aspects, given by way of example only, are described in order to provide a more precise understanding of the subject matter of several embodiments.

Figure 1A:
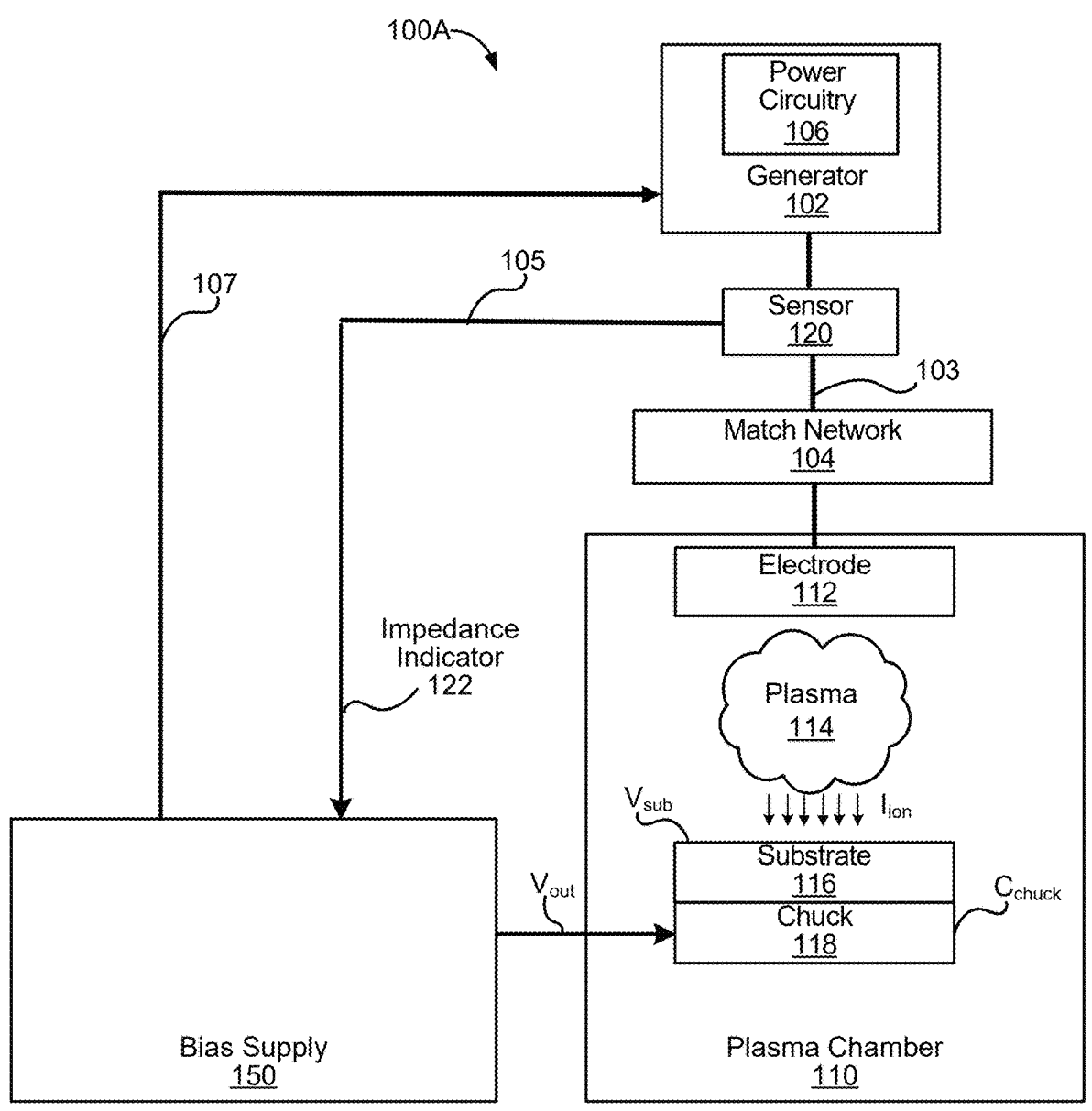
FIG. 1A is a block diagram of a plasma processing system in accordance with an embodiment of this disclosure.

FIG. 1A is a block diagram of a plasma processing system 100A in accordance with an embodiment of this disclosure. Plasma processing system 100A is an example system (e.g., deposition or etch system) in which a bias supply 150 may be utilized. In this example, plasma processing system 100A includes a generator 102, match network 104, and plasma chamber 110. Power circuitry 106 of the generator 102 provides power (e.g., radio frequency power) via match network 104 to plasma chamber 110 to ignite and sustain a plasma 114. The power circuitry 106 includes components well known to those of ordinary kill in the art, such as without limitation, an amplifier that amplifies a reference signal to produce a controllable source waveform that may be several megahertz, such as for example and without limitation, 13.56 MHz, 40 MHz, or 60 MHz. Plasma chamber 110 includes one or more electrodes 112 configured to generate plasma 114 from the source power of generator 102, which is also referred to herein as a source generator 102. Within plasma chamber 110, a substrate 116 (e.g., silicon wafer) is supported or held by a chuck 118. Ions and electrons of plasma 114 react with and modify the surface of substrate 116 through processes such as etching or deposition.

Bias supply 150 provides a controlled electrical bias to substrate 116 for fine-tuning plasma processing conditions. In particular, bias supply 150 may be configured to apply an output voltage $V_{out}$ to chuck 118 (e.g., an electrostatic chuck or electrode) configured to create an electric field between plasma 114 and substrate 116. The electrical potential difference between plasma 114 and substrate 116 is referred to as substrate voltage $V_{sub}$, and the magnitude of this voltage determines the kinetic energy of ions of plasma 114 striking the surface of substrate 116. Substrate voltage $V_{sub}$ also affects the ion energy distribution (IED) at the surface of substrate 116 which is a factor in the uniformity and quality of plasma processing results.

Conventional plasma processing techniques bias with an output voltage comprising a direct-current (DC) pulsed waveform or sinusoidal waveform. However, DC pulsed waveforms result in an undesirable and difficult-to-control spread of ion energies, and sinusoidal waveforms result in an undesirable IED having multiple concentrations of ion energies. For improved control of IED, bias supply 150 may provide an asymmetric waveform as described in greater detail below.

Figure 2A:
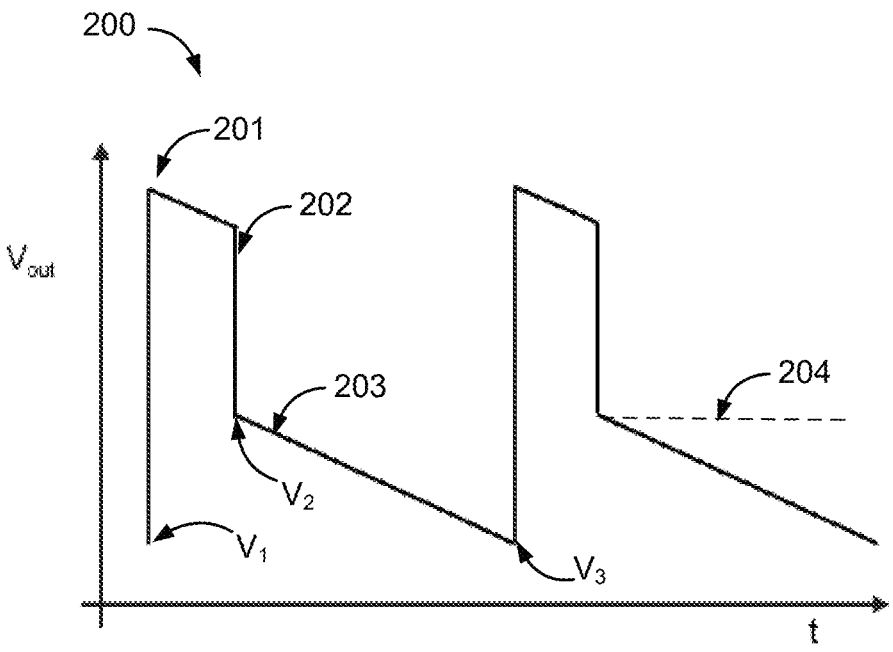
FIG. 2A illustrates an example waveform that can be generated by a bias supply of the present disclosure.
Figure 2B:
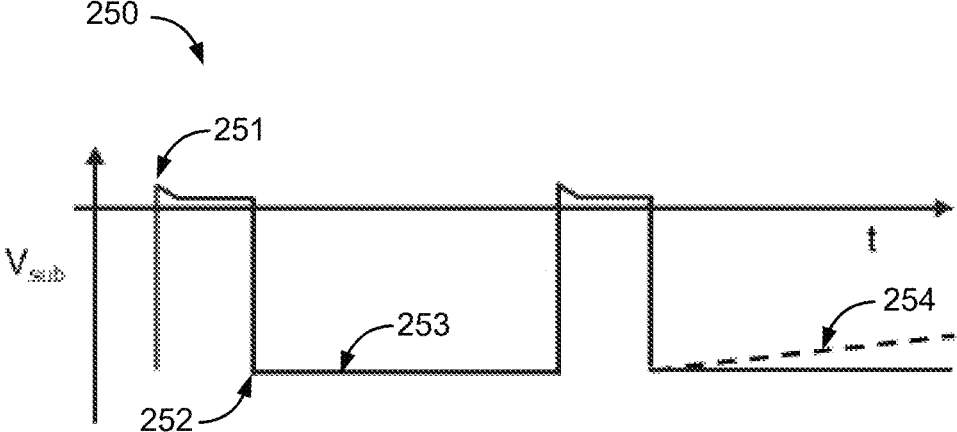
FIG. 2B illustrates an example substrate voltage resulting from the waveform of FIG. 2A.

FIG. 2A illustrates an example waveform 200 that can be generated by bias supply 150 of the present disclosure. FIG. 2B illustrates an example substrate voltage 250 resulting from the waveform 200 of FIG. 2A. As shown in FIG. 2A, waveform 200 may comprise an asymmetric, periodic voltage (e.g., $V_{out}$) comprising a first section that begins with a first negative voltage $V_1$, followed by an increase to a peak voltage 201, followed by a decrease, or step voltage 202, to a second negative voltage $V_2$. It also comprises a second section that begins with the second negative voltage $V_2$ and includes a ramp voltage 203 between the second negative voltage $V_2$ and a third negative voltage $V_3$.

The increase, or step, from first negative voltage $V_1$ to peak voltage 201 may comprise a voltage reversal which resets or neutralizes the charge on the surface of substrate 116. This drives substrate voltage $V_{sub}$ to a corresponding peak voltage 251 that is slightly positive to reset the charge on the surface of substrate 116. Assuming, for example, a 400 kHz frequency of waveform 200, voltage reversal may repeat approximately every 2.5 μsec. Subsequent to the voltage reversal (e.g., approximately 500 nsec after the voltage reversal), step voltage 202 drops to second negative voltage $V_2$ and the magnitude of this voltage drop defines an initial negative substrate voltage 252. Step voltage 202 may comprise a parameter used as a setpoint to produce ions at a desired energy level.

Ramp voltage 203 decreases over time between second negative voltage $V_2$ and third negative voltage $V_3$. Ramp voltage 203 may comprise a slope, sometimes referred to as dV/dt, configured to counteract an accumulation of charge on substrate 116 by ions from plasma 114 until the next reversal/reset occurs. For instance, when the slope of ramp voltage 203 is appropriately set, it produces a corresponding voltage section 253 of substrate voltage $V_{sub}$ that is constant, or approximately constant, and maintains the desired ionf energy level as defined by the initial negative substrate voltage 252. By contrast, if the change in bias voltage over time is too steep or not steep enough (e.g., as indicated by dashed line 204) an over-compensated condition or under-compensated condition (e.g., as indicated by dashed line 254) occurs in the substrate voltage $V_{sub}$, which can result in undesirable IED and poor processing outcomes. However, it will be appreciated that, in some embodiments, it may be desirable to achieve a broader spread of ion energies and thus ramp voltage 203 may be deliberately controlled to effectuate an over-compensated condition or under-compensated condition in applications for which this is desirable.

Referring again to FIG. 1A, bias supply 150 is configured to apply a ramp voltage (e.g., ramp voltage 203) to neutralize the effects of accumulating charge on the surface of substrate 116. In conventional plasma biasing techniques, determination of the slope of ramp voltage 203 involves measurement or prediction of capacitances present in plasma chamber 110. For instance, if chuck capacitance $C_{chuck}$ (e.g., a series capacitance measured from the bias electrode feed to the surface of the bias electrode) is known, this information may be used to adjust the ion current compensation created by the ramp voltage. However, a downside to this approach is that chuck capacitance $C_{chuck}$ may be unknown or uncertain due to effects of operating frequency, mechanical degradation, or chamber-to-chamber mismatch.

To address these issues, plasma processing system 100A is enhanced with bias supply 150 configured to dynamically control a ramp voltage (e.g., ramp voltage 203) based on an impedance indicator 122, which may be in the form of a signal indicative of power reflected to the generator 102. Plasma processing system 100A also includes one or more sensors 120 configured to monitor or measure one or more parameters indicative of power reflected to the generator 102 such as an impedance value or change of plasma 114, and to provide the parameter(s) in the form of an impedance indicator 122 to bias supply 150. As discussed further herein, the sensor 120 may be located within the generator 102 so that the impedance indicator 122 is also provided to a controller of the generator 102. Advantageously, bias supply 150 is able to dynamically and accurately control ramp voltage 203, and thus a desired substrate voltage $V_{sub}$, without relying on knowledge of chamber capacitances. As described in greater detail below, this control technique leverages the relationship between plasma impedance and substrate voltage $V_{sub}$ by using real-time signals indicative of power reflected to the generator such as impedance value indicators as a feedback mechanism.

As is known to those of ordinary skill in the art, a signal indicative of power reflected to the generator 102, such as the impedance indicator 122, may also be used as feedback to control the match network 104 and/or a frequency of the generator 102. In addition, the impedance indicator 122 may be used to obtain information about the processing environment of the plasma chamber 110. Some aspects disclosed herein relate to synchronizing the bias supply 150 with a controller that is used in connection with the generator 102 and/or match network 104 to enable the impedance indicator 122 to be more intelligently represented based upon when portions of the waveform 200 are occurring.

Figure 3:
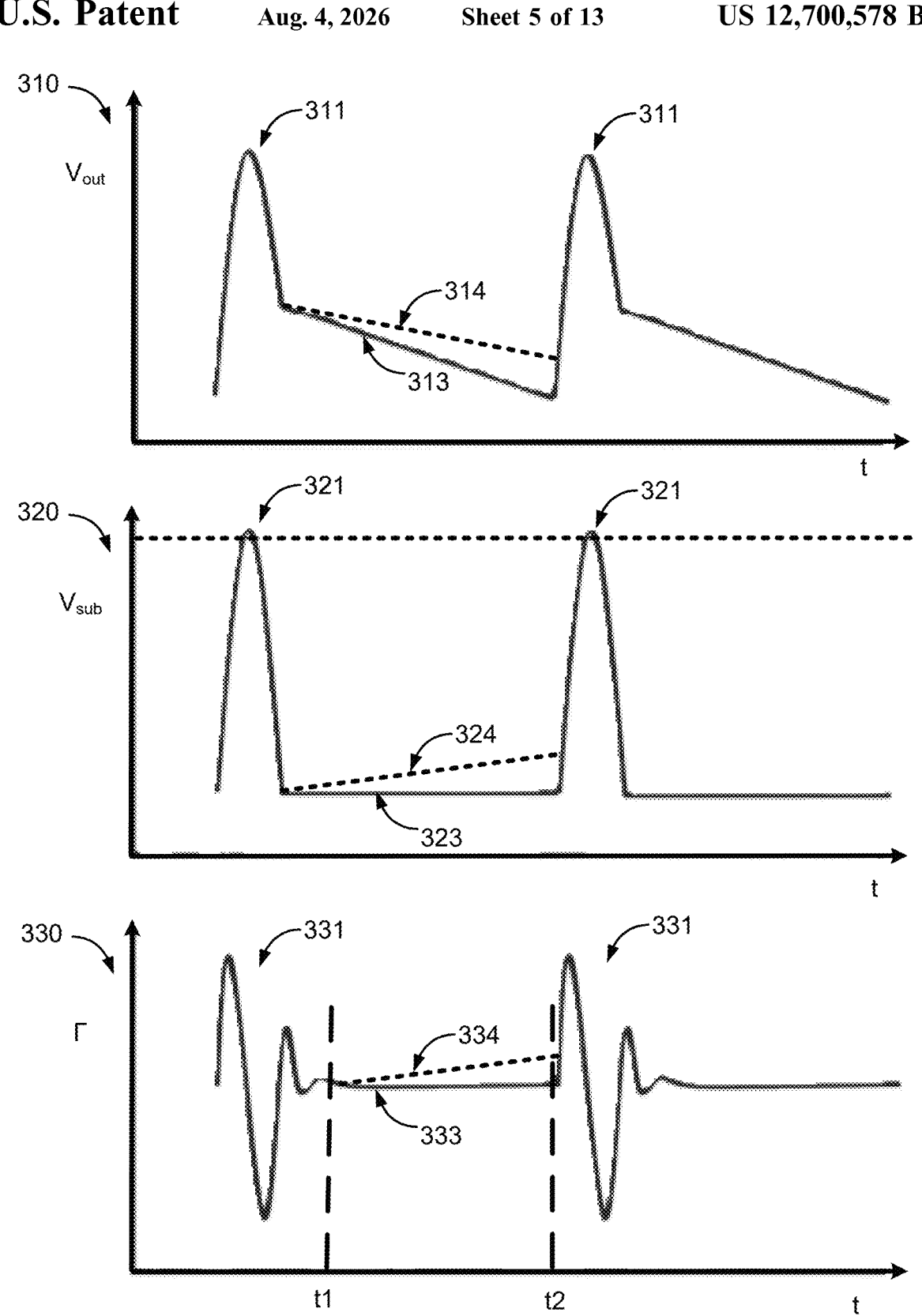
FIG. 3 illustrates a first graph of an example output voltage that can be generated by a bias supply, a second graph of an example corresponding substrate voltage and a third graph of an example corresponding impedance indicator.

FIG. 3 illustrates a first graph 310 of an example output voltage $V_{out}$ that can be generated by bias supply 150, a second graph 320 of an example signal corresponding substrate voltage $V_{sub}$, and a third graph 330 of an example signal indicative of power reflected to the generator, which is an impedance indicator. Assume, for this example, the impedance indicator is a reflection coefficient, sometimes denoted as gamma, that represents the ratio of voltage reflected back toward generator 102. The reflection coefficient may be signal, and that signal is indicative of power reflected to the generator and it is also an indicator of plasma impedance because it relates to the mismatch between the plasma impedance and source impedance.

As shown in first graph 310, bias supply 150 may output a first portion 311 of a periodic waveform that has an abrupt positive/negative transition. This drives a corresponding first portion 321 of substrate voltage $V_{sub}$ shown in second graph 320. When substrate voltage $V_{sub}$ changes rapidly, the characteristics of the plasma sheath (i.e., a boundary layer that forms between plasma 114 and substrate 116), such as its thickness and the electric field within it, also change rapidly. Since plasma impedance is a measure of how easily these particles can move (i.e., how easily current can flow), a change in the sheath results in a change in the plasma impedance. Accordingly, during application of first portion 311 of the waveform, plasma impedance changes as indicated by fluctuation 331 in reflection coefficient of third graph 330.

On the other hand, during application of a ramp voltage 313 (e.g., a second portion of the waveform that is between positive/negative transitions), plasma impedance is generally stable. That is, if the slope of ramp voltage 313 is appropriately set to counteract ion charge accumulation, it results in a corresponding second portion 323 of substrate voltage $V_{sub}$ that is constant, as shown in second graph 320, indicating substrate 116 is appropriately compensated. Moreover, when substrate voltage $V_{sub}$ is constant during ramp voltage 313, plasma impedance also remains constant during this period, as shown by the corresponding second portion 333 of the reflection coefficient that is flat between fluctuations 331.

If the ramp voltage slope is not appropriately set, as indicated by dashed line 314, it results in a corresponding second portion 324 of substrate voltage $V_{sub}$ that is non-constant, indicating substrate 116 is over-compensated or under-compensated. For instance, if the slope is too steep it may result in $V_{sub}$ with a negative slope and ion current over-compensating substrate 116, and if the slope is too gradual it may result in $V_{sub}$ with a positive slope and ion current under-compensating substrate 116. Moreover, if $V_{sub}$ has a slope, or is non-constant, during the ramp voltage (e.g., as shown by second portion 324 of second graph 320), it may cause plasma impedance to have a corresponding second portion 334 that is non-constant during this period (e.g., as shown by dashed line of third graph 330). Put another way, during a time period that the ramp voltage is being applied, a detected slope in plasma impedance may indicate an undesirable substrate voltage $V_{sub}$ condition.

Accordingly, in this example, bias supply 150 may use the reflection coefficient to control the slope of the ramp voltage and correct the substrate voltage $V_{sub}$ to a desired value or profile. Sensor 120 may measure the reflection coefficient during a ramp voltage portion of a non-sinusoidal bias. If the reflection coefficient is detected or determined to have a non-zero slope during this period, bias supply 150 increases or decreases the slope of the ramp voltage such that the reflection coefficient, and thus substrate voltage $V_{sub}$, returns to constant. In other words, bias supply 150 may adjust the slope of ramp voltage until it detects or determines its impedance indicator feedback is flat, indicating a desired current compensation of substrate 116. By biasing the electrical potential of substrate 116 with this control technique, the energy of ions striking the surface of substrate 116 is precisely controlled without reliance on potentially inaccurate system parameters such as chuck capacitance $C_{chuck}$.

In one embodiment, bias supply 150 is configured to process/analyze the sensor data to extract a portion of impedance indicator(s) 122 to use for feedback control. That is, bias supply 150 may determine impedance indicator values measured during the ramp voltage portion of the waveform and use those values for feedback control, and ignore values measured during other portions of the waveform. In continuing with the example of FIG. 3, for instance, bias supply 150 may use a frequency threshold to filter out fluctuations 331 in the reflection coefficient. This extracts impedance indicator values, or a portion of an impedance indicator waveform (e.g., second portion 333/334 between times t1 and t2 in third graph 330) that is a non-fluctuating portion corresponding in time with the ramp voltage. Bias supply 150 may use the non-fluctuating portion or stable portion of the impedance indicator waveform as feedback for controlling the ramp voltage.

In some embodiments, it may be desirable to effectuate an over-compensated condition or under-compensated condition of substrate 116, and bias supply 150 may control the ramp voltage to induce the impedance indicator 122 to have a slope, or be non-constant, such that substrate voltage $V_{sub}$ has the desired slope or non-constant value. That is, bias supply 150 may adjust the slope of the ramp voltage until it detects or determines its impedance indicator feedback reaches the desired profile, and then maintain the ramp voltage that induces the desired profile. In some embodiments, bias supply 150 controls a duration of the ramp voltage based on impedance indicator 122.

Although reflection coefficient discussed with respect to FIG. 3 is one example of impedance indicator 122, it will be appreciated that one or more alternative parameters may be used that are indicative of power reflected to the generator 102. One example of impedance indicator 122 is the measured magnitude of plasma impedance. Another example is Voltage Standing Wave Ratio (VSWR), which is the ratio of the maximum voltage to the minimum voltage in the standing wave pattern along a transmission line 103 (e.g., electrical coupling which delivers RF power generated by generator 102 to plasma chamber 110) and is indicative of plasma impedance and power reflected to the generator 102 since it is a measure of how effectively RF power is transmitted from the power source into plasma 114. Another example of impedance indicator 122 is peak-to-peak voltage of the RF waveform applied to plasma 114. Changes in the peak-to-peak voltage can indicate fluctuations in the plasma impedance and power reflected to the generator 102. Similarly, changes in voltage, current, power (e.g., forward, reflected, or delivered power), and phase in the RF waveform can also indicate fluctuations in the plasma impedance and power reflected to the generator and thus also represent potential candidates for impedance indicator 122.

Additionally, one or more sensors 120 used to detect impedance indicator(s) 122 can vary in type and integration within plasma processing system 100A. Sensor 120 may be electrically coupled with transmission line 103 to measure one or more parameters indicative of power reflected to the generator 102 such as plasma impedance values. Additionally, sensor 120 may be communicatively coupled to bias supply 150 via wired or wireless communication line 105 to provide a signal indicative of power reflected to the generator 102, such as the impedance indicator 122, for feedback control. Sensor 120 may comprise a standalone sensor or be integrated with generator 102 and/or match network 104. For instance, sensor 120 may be arranged at an output of generator 102 and/or match network 104, and measure plasma impedance seen by generator 102 or transmission line 103. Sensor 120 may comprise, for example, a V-I sensor, directional coupler, phase and gain sensor, voltage sensor, or current sensor.

In addition, the generator 102 and bias supply 150 are coupled by another communication line 107 that enables timing information from the bias supply 150 to be communicated to the generator 102. As discussed further herein, the timing information may be waveform information from the bias supply 150 and it may inform the generator 102 when one or more of the portions of the waveform 200 are occurring to provide the generator 102 with an awareness of changes to the impedance indicator 122 over time relative to the waveform of the bias supply 150.

The benefit of having an awareness of changes in power reflected to the generator 102 (e.g., as shown by the impedance indicator 122) over time relative to timing of the waveform 200 of the bias supply 150 may be appreciated with reference again to FIG. 3. Specifically, FIG. 3 depicts an issue when the impedance indicator 122 (e.g., gamma) is used as a control parameter and/or an informational parameter. For example, when the impedance indicator 122 is used to control the match network 104 and/or the frequency of the generator 102, the fluctuation 331 in the reflection coefficient depicted in the third graph 330 may adversely affect the value of the impedance indicator 122. More specifically, some generators are known to sample gamma on an ongoing basis and then average the samples of gamma. But the resultant average does not convey that gamma may be substantially zero during the time from t1 to t2 because the resultant average for gamma will be non-zero. This may be an issue because the value of gamma from t1 to t2 may be a preferred control parameter value and/or a preferred reference readback parameter value.

According to some aspects of this disclosure, timing information from the bias supply 150 provided by the communication line 107 enables a controller to synchronize feedback and/or readback of the impedance indicator 122 with the bias supply 150. As discussed further herein, the timing information may simply be a synchronization signal (e.g., a five volt signal) that indicates when the waveform 200 is beginning, and known information about the length of the first portion 311 of the waveform 200 may enable the controller to determine when to start sampling gamma. For example, the controller may start sampling gamma at t1 to obtain a representation of gamma when gamma is stable. In this way, the controller 124 may extract a non-fluctuating portion of the impedance indicator 122. For example, the timing information may simply be a signal provided every 2.5 microseconds to enable controller 124 to synchronize with the bias supply 150. As an example without limitation, the synchronization signal may be provided once during each cycle of the bias waveform 200 when the bias supply 150 is providing a peak of the bias waveform 200. It is also contemplated that more detailed timing information may be provided via the communication line 107 about when the first portion 311 starts and stops and when the ramp voltage 313 starts and stops to enable a report to be provided that is indicative of power reflected to the generator based upon the timing information.

Another aspect disclosed herein is the ability to provide two gamma values. For example, a first value for gamma may be calculated (e.g., as an average) based upon measurements of gamma during the fluctuation 331 and a second value for gamma may be calculated (e.g., as an average) based upon measurements of gamma during the second portion 333 between t1 and t3. A report indicative of power reflected to the generator 102 (e.g., in terms of gamma) based upon the timing information may be provided that includes the first value and the second value.

Figure 1B:
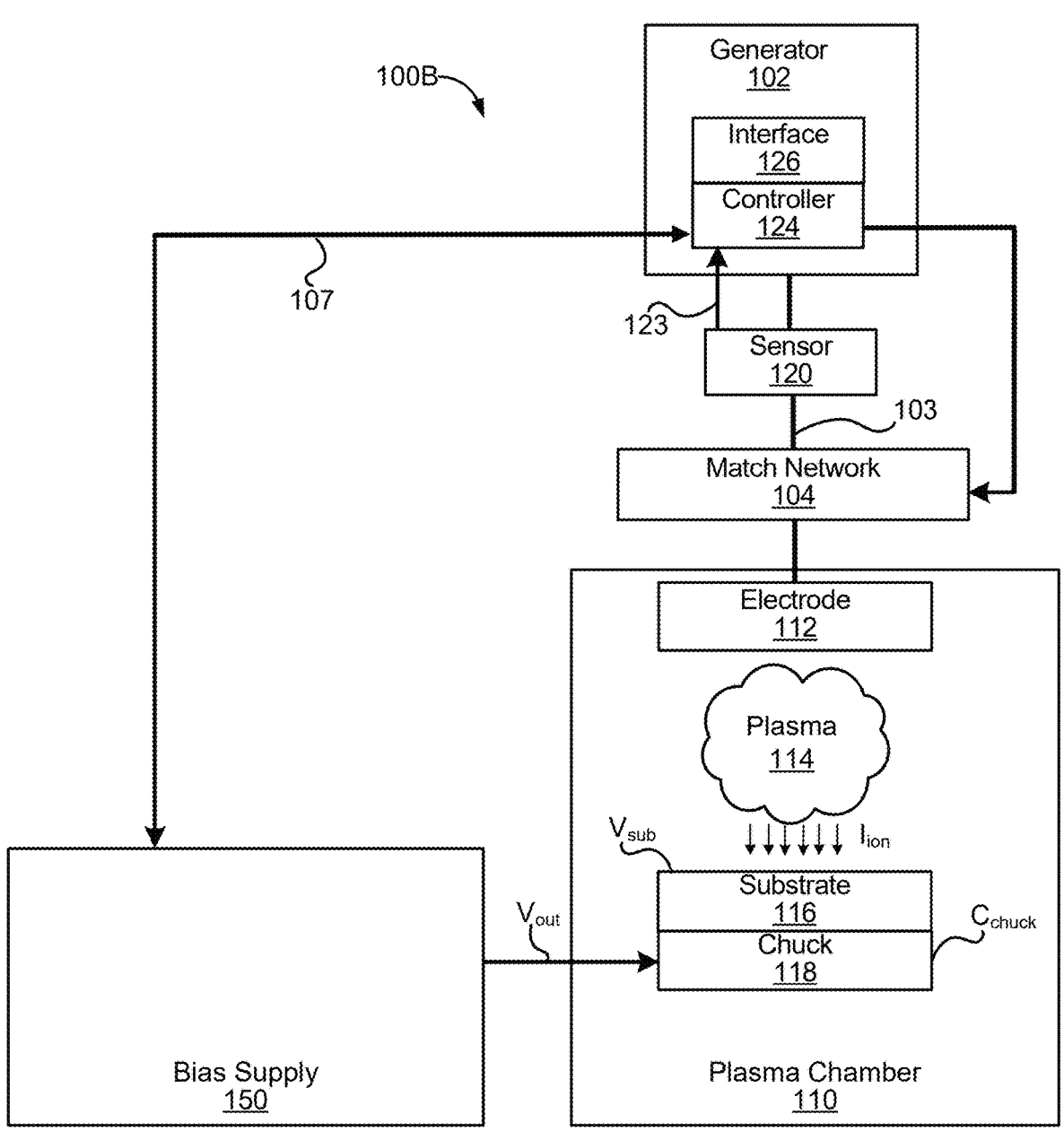
FIG. 1B is a block diagram of a plasma processing system in accordance with another embodiment of this disclosure.

As shown in FIG. 1A, the communication line 107 may be a unidirectional communication line wherein the bias supply 150 only provides information to the generator 102. In other variations, the communication line 107 may be a bidirectional communication link that enables the signal (e.g., the impedance indicator 122) indicative of power reflected to the generator 102 to be communicated via the generator 102. Referring to FIG. 1B, for example, the generator 102 includes a controller 124 that is configured to receive, at an input port, the signal (e.g., the impedance indicator 122) indicative of power reflected to the generator 102 via a communication link 123 from the sensor 120 and convey the signal (e.g., the impedance indicator 122) indicative of power reflected to the generator 102 to the bias supply 150 while the controller 124 receives the timing information (providing information about the waveform 200) via the communication line 107. It should be recognized that the sensor 120 may be a portion of the generator 102. For example, the sensor 120 may be located within a housing of the generator 102 and the communication link 123 may be a communication link that is within the generator 102.

Figure 1C:
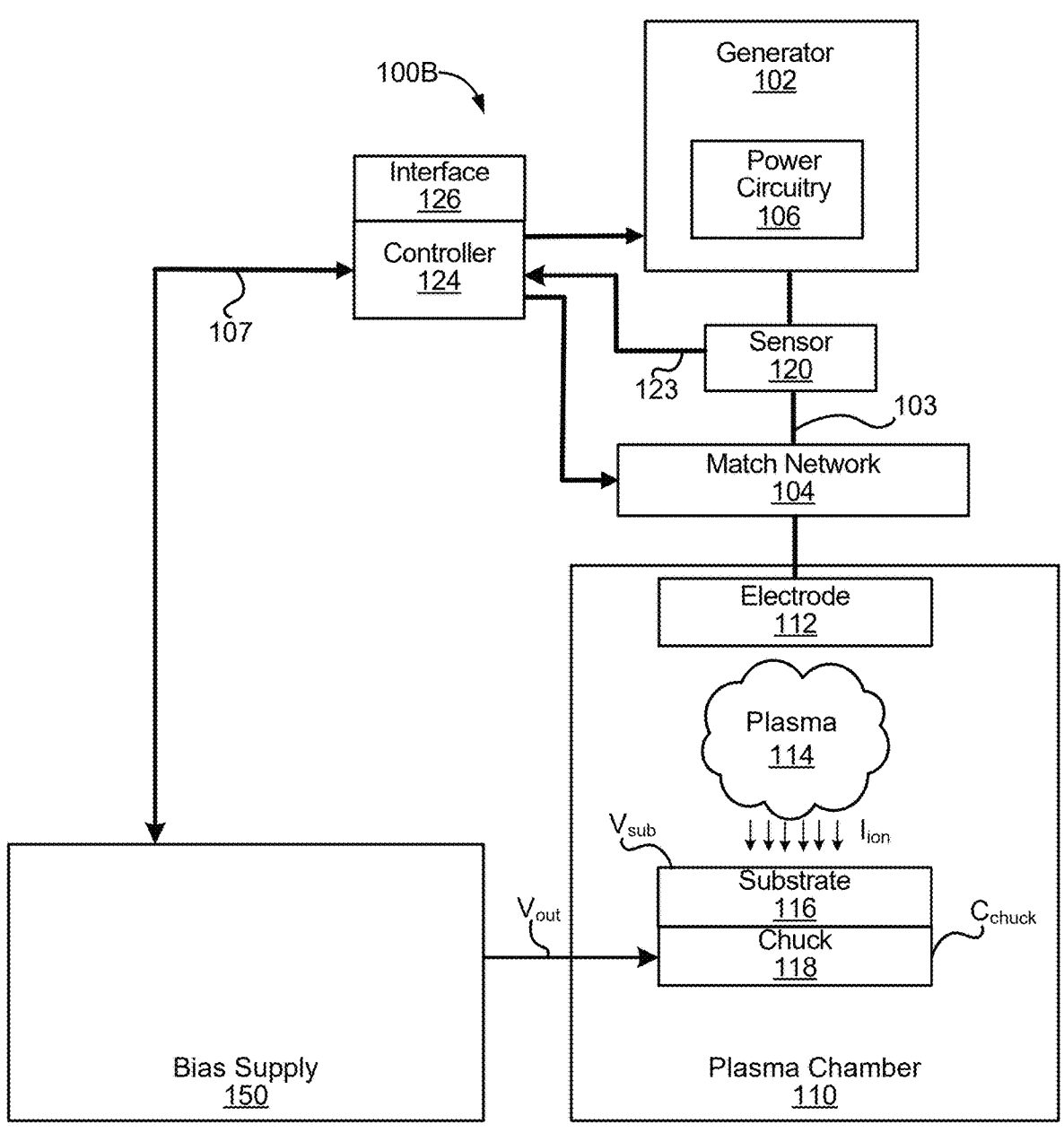
FIG. 1C is a block diagram of a plasma processing system in accordance with yet another embodiment of this disclosure.

It should also be recognized that that the depiction of the controller 124 is logical and that the controller 124 may be distributed among the several components of the plasma processing system 100B, and the controller 124 may be located anywhere within a reasonable distance of the generator 102, match network 104, and the bias supply 150. As an example, FIG. 1C depicts the controller 124 as being centrally located so that the controller 124 is configured to communicate with each of the generator 102, match network 104, and the bias supply 150.

Also shown in FIG. 1B is a user interface 126 that may be included with the generator 102 to provide an operator of the generator 102 information about power-related parameters such as a report indicative of power reflected to the generator that is based upon the timing information. As discussed above, information about power reflected to the generator 102 may be reported in terms of multiple gamma values where, for example and without limitation, one gamma value may be representative of plasma impedance from the time from t1 to t2 and another gamma value may be representative of plasma impedance over a full cycle of the bias waveform.

In some embodiments, bias supply 150 converts and/or calculates plasma impedance measurements from sensor data. For example, bias supply 150 may include analog-to-digital conversion components to convert analog signals from sensor 120 to digital representations of the measured characteristic of plasma impedance. Alternatively, sensor 120 may include analog-to-digital conversion components, and bias supply 150 may receive the digital representation and/or converted version of the measured characteristic of plasma impedance. Additionally, bias supply 150 may receive and store thresholds or instructions for processing/ analyzing one or more types of impedance indicators (that are indicative of power reflected to the generator). For instance, a frequency threshold is described above with respect to a reflection coefficient example, and it will be appreciated that corresponding thresholds of other parameter and indicator types may be implemented.

It will further be appreciated that numerous variations of plasma processing system 100A-C are possible to suit a wide range of applications and desired processing outcomes. For example, plasma processing system 100A-C may incorporate multiple generators 102 and/or multiple bias supplies 150. One or more generators 102 and one or more bias supplies 150 may be coupled to the same electrode (e.g., electrode 112 or chuck 118). One or more filters may serve to isolate generator 102 and bias supply 150. Moreover, electrode 112 may be implemented with an inductively coupled plasma (ICP) source, a dual capacitively-coupled plasma source (CCP) comprising a secondary top electrode biased at another RF frequency, a helicon plasma source, a microwave plasma source, a magnetron, or some other independently operated source of plasma energy. In any case, the plasma load is characterized by its impedance, which is a complex value that includes both resistive and reactive components, and this impedance can change dynamically as processing conditions change.

Figure 4:
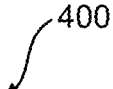
FIG. 4 is a flowchart illustrating a method of biasing a substrate for plasma processing in an example embodiment.
Figure 4:
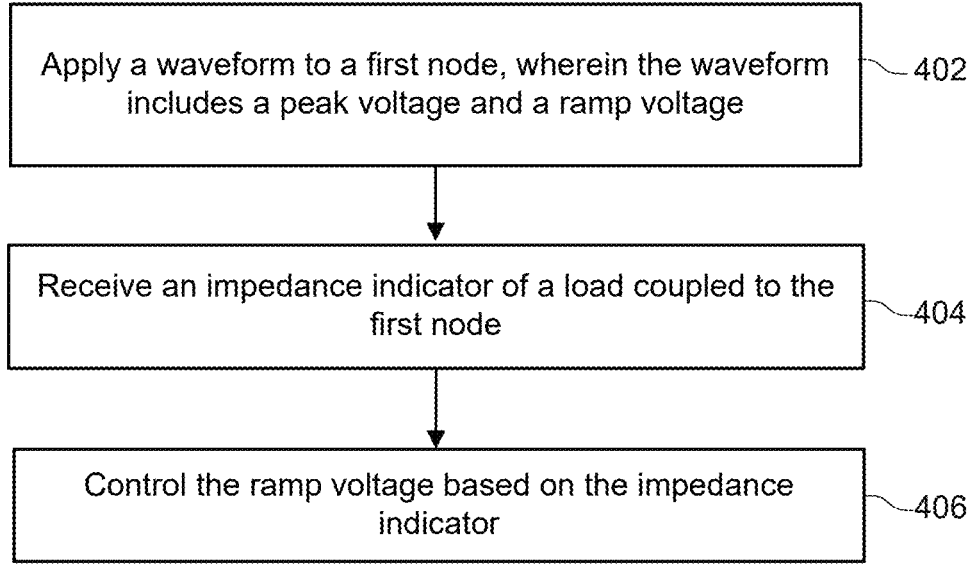

FIG. 4 is a flowchart illustrating a method 400 of biasing a substrate for plasma processing in an example embodiment. The steps of the method are described with reference to the plasma processing system 100A of FIG. 1, but those skilled in the art will appreciate that the method may be performed in other systems. The steps of the flowcharts described herein are not all inclusive, may include other steps not shown, and may be performed in an alternative order.

In step 402, bias supply 150 applies a waveform to a first node, wherein the waveform includes a peak voltage 201 and a ramp voltage 203. In step 404, bias supply 150 receives an impedance indicator of a load coupled to the first node. In step 406, bias supply 150 controls the ramp voltage 203 based on the impedance indicator.

Figure 5A:
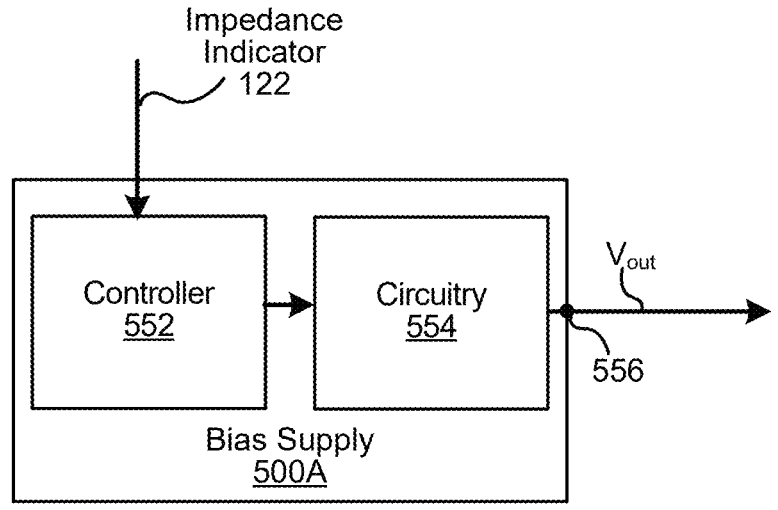
FIG. 5A is a block diagram of an example bias supply that may be used to implement a bias supply of the disclosure.

FIG. 5A is a block diagram of an example bias supply 500A that may be used to implement bias supply of the disclosure. Bias supply 500A generally functions to apply a periodic voltage function (e.g., output voltage $V_{out}$) to an output node 556, sometimes referred to as a first node. Bias supply 500A includes, or couples with, a controller 552 configured to communicatively couple with a sensor (e.g., sensor 120) and receive impedance indicator 122. Bias supply 500 also includes circuitry 554 coupled with controller 552 and configured to generate the periodic voltage function based on input from controller 552. In one embodiment, controller 552 determines or calculates an adjustment of slope of the ramp voltage based on impedance indicator 122, and directs circuitry 554 to effectuate or induce the adjustment in the ramp voltage.

Figure 5B:
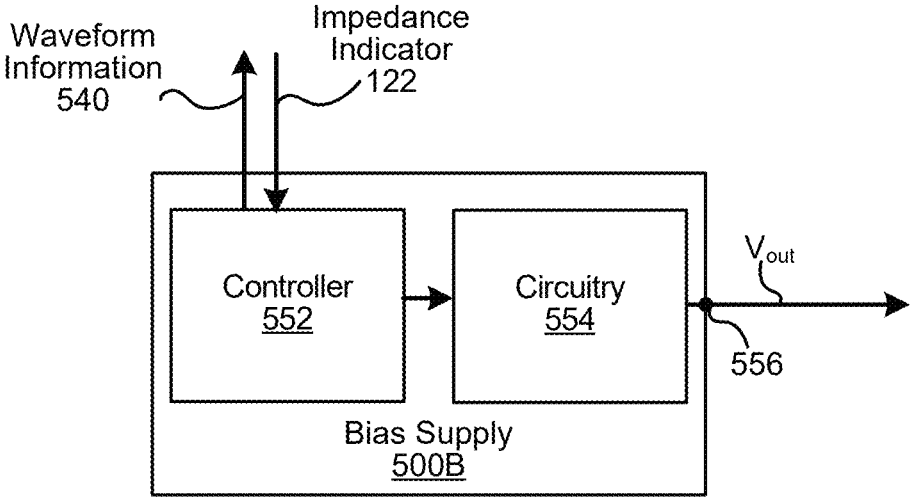
FIG. 5B is a block diagram depicting another example of a bias supply.

FIG. 5B is a block diagram of another example bias supply 500B wherein the controller 552 is also configured to provide waveform information 540 to controller 124 to enable the controller 124 to process, as discussed above, measurements of the impedance indicator 122 based upon the bias waveform information.

Figure 6:
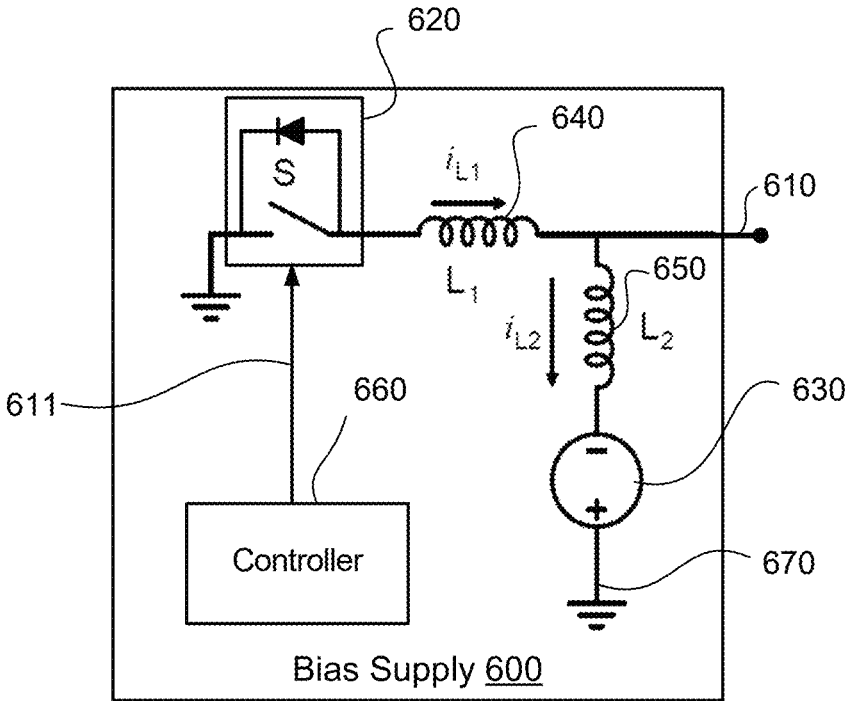
FIG. 6 illustrates an example topology that may be used to implement a bias supply of the disclosure.

FIG. 6 is a block diagram of another example bias supply 600 that may be used to implement bias supply of the disclosure. Bias supply 600 includes an output 610 (also referred to as an output node or first node), a switch 620, and a voltage source 630. In addition, a first inductor 640 is coupled between switch 620 and output 610, and a second inductor 650 is coupled between voltage source 630 and output 610. Also shown is a controller 660 that is configured to open and close switch 620 to produce a voltage (e.g., $V_{out}$). Switch 620 may include a body diode to allow for reverse current flow even when switch 620 is not controlled to be in an on state. Switch 620 may be realized, for example, by silicon carbide metal-oxide semiconductor field-effect transistors (SiC MOSFETs), though other types of switches may be used. Switch 620 may be driven by a drive signal 611 from controller 660, and drive signal 611 may be electrical or optical.

Figure 7:
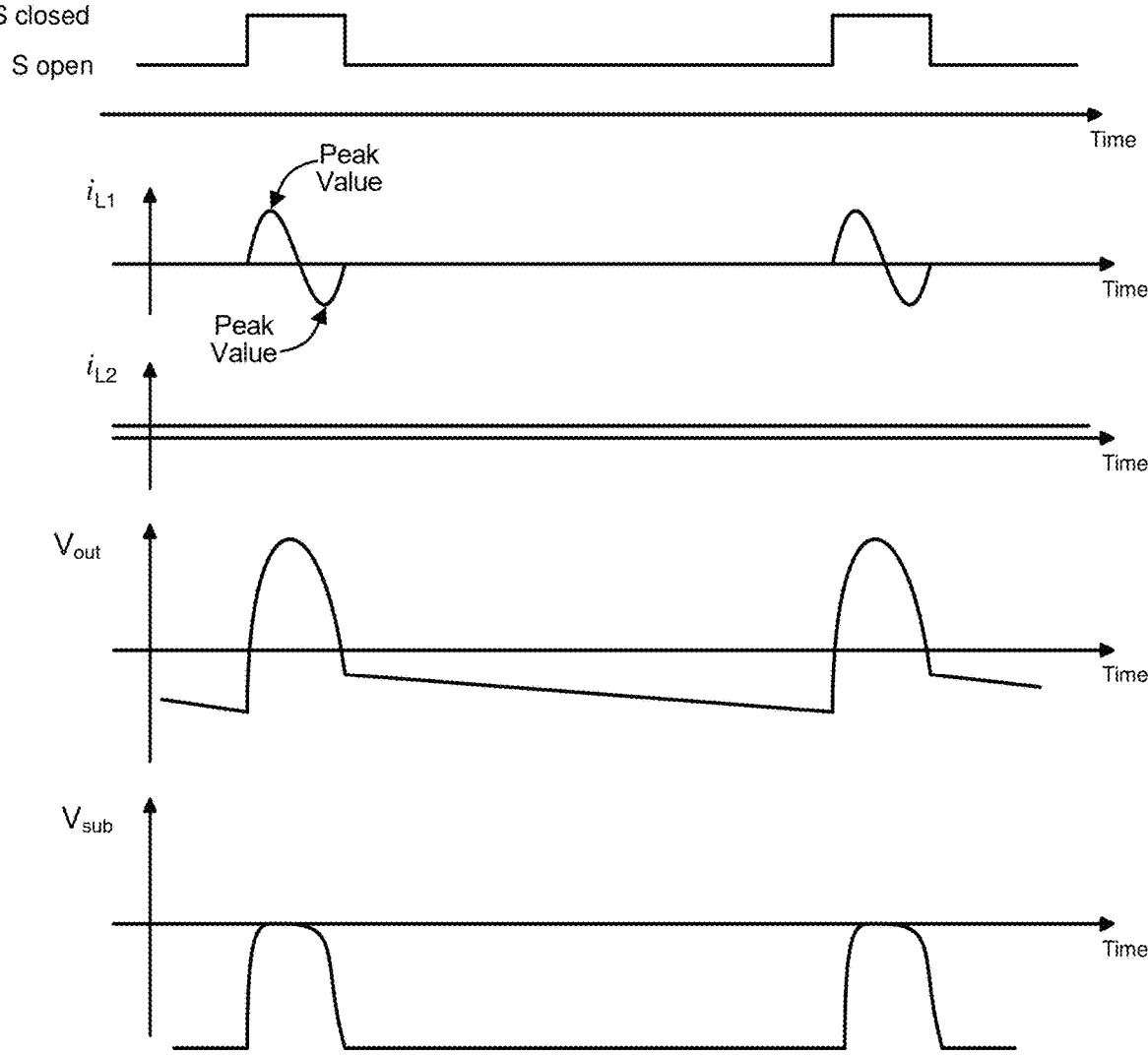
FIG. 7 illustrates an example timing chart for operating the bias supply of FIG. 6.

FIG. 7 illustrates an example timing chart for operating bias supply 600 of FIG. 6. The timing chart depicts electrical aspects of bias supply 600 and a plasma processing chamber. Controller 660 may be configured to cause an application of a periodic voltage (e.g., $V_{out}$) between output 610 and a ground connection 670 (or return node) by repeatedly closing switch 620 for a time just long enough for current $i_{L1}$ through first inductor 640, and hence switch 620, to complete a full cycle from zero to a peak value, back to zero, to a peak value in an opposite direction and back to zero. Current delivered to the load through output 610 may be returned to bias supply 600 through ground connection 670 that is common with the load. Ion current may be properly compensated when current $i_{L2}$ through the second inductor, L2, equals the ion current. Controller 660 may also be configured to adjust a voltage of voltage source 630 and a time between the repeated switch closures to produce a periodic voltage $V_{out}$ that achieves a desired substrate voltage $V_{sub}$.

Figure 8:
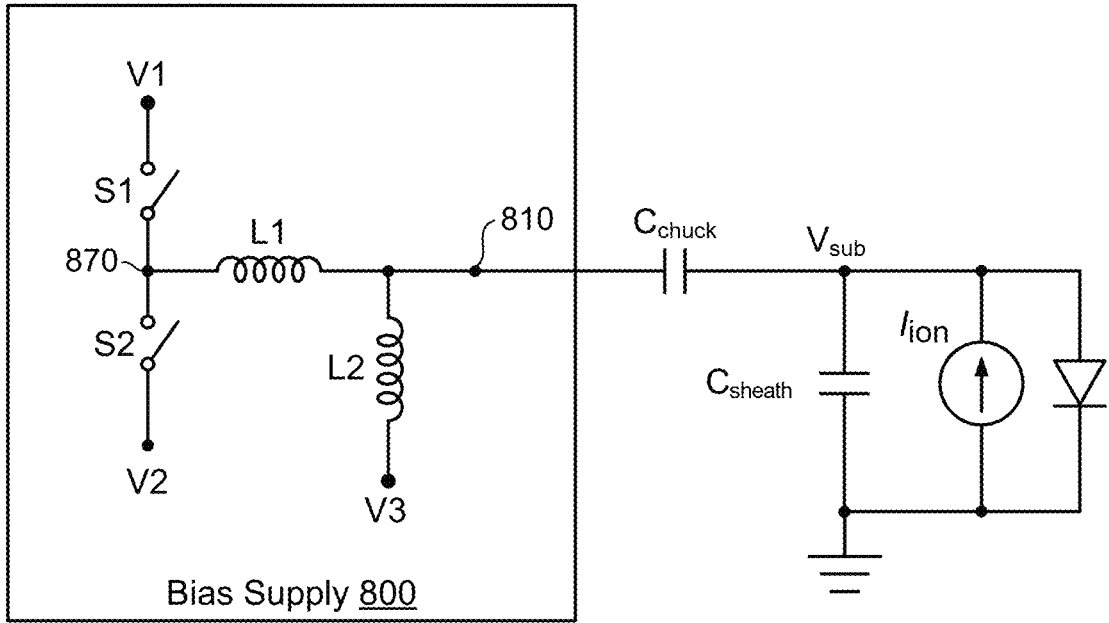
FIG. 8 is a block diagram of yet another example bias supply that may be used to implement bias supply of the disclosure.

FIG. 8 is a block diagram of yet another example bias supply 800 that may be used to implement bias supply of the disclosure. Bias supply 800 utilizes three voltages V1, V2, and V3. As shown, an output 810 may be capacitively coupled through chuck capacitance $C_{chuck}$, and thus it may be unnecessary to control a DC level of $V_{out}$ and the three voltages can be reduced to two by choosing one of V1, V2 or V3 to be ground (OV). A separate chucking supply may be used so it is not necessary to control the DC level of $V_{out}$. If a separate chucking supply is not used, all three voltages can be controlled to control the DC level of $V_{out}$. Although not shown for clarity, the two switches S1 and S2 may be controlled by a switch controller via electrical or optical connection to enable the switch controller to open and close switches S1 and S2. The depicted switches S1 and S2 may be realized by single pole, single throw switches, and as a non-limiting example, switches S1 and S2 may be realized by SiC MOSFETs.

In this implementation, the voltages V1, V2, and V3 may be DC-sourced voltages. As shown, first switch S1 is disposed to switchably connect a first voltage V1 to output 810 through an inductive element and second switch S2 is disposed to switchably couple the second voltage, V2, to output 810 through an inductive element. In this implementation, the two switches connect to a common node 870, and a common inductive element, L1, is disposed between common node 870 and output 810. Other arrangements of the inductive elements are possible. For example, there may be two separate inductive elements with one inductive element connecting S1 to output 810 and another connecting S2 to output 810. In another example, one inductive element may connect S1 to S2 and another inductive element may connect either S1 or S2 to output 810.

Figure 9:
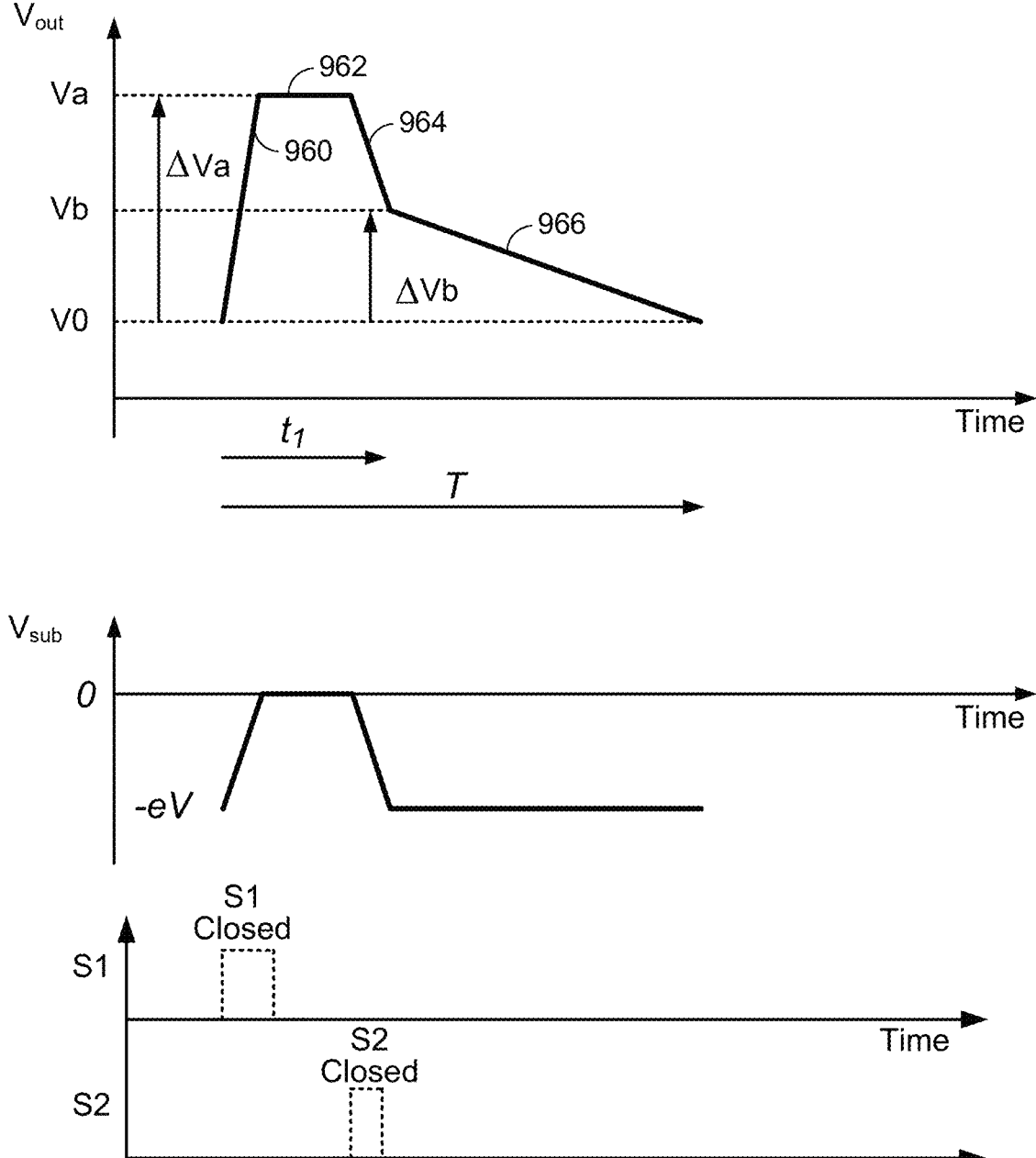
FIG. 9 illustrates an example timing chart for operating the bias supply of FIG. 8.

FIG. 9 illustrates an example timing chart for operating bias supply 800 of FIG. 8. This timing chart depicts: 1) a cycle of the asymmetric periodic voltage waveform (e.g., $V_{out}$) of bias supply 800 applied to output 810; 2) a corresponding substrate voltage; and 3) corresponding switch positions of switches S1 and S2. As shown, the periodic voltage waveform that is output by bias supply 800 is asymmetric, so that a first half-cycle of the voltage waveform does not have a corresponding symmetrical component during a last half-cycle of the voltage waveform. In operation, first switch S1 is closed momentarily to increase, along a first portion 960 of the voltage waveform (between voltage V0 and Va), a level of the voltage at output 810 to a first voltage level, Va. The level Va is maintained along a second portion 962 of the waveform. Second switch S2 is then closed momentarily to decrease, along a third portion 964 of the waveform, the level of the voltage waveform at output 810 to a second voltage level, Vb. Note that S1 and S2 are open except for short periods of time. As shown, the negative voltage swing along the third portion 964 affects the substrate voltage; thus, a magnitude of Va-Vb may be controlled to affect the substrate voltage.

In this embodiment, while the first and second switches S1, S2 are open, the third voltage, V3, is applied to output 810 through a second inductive element L2 to further decrease a level of the voltage at the output node along a fourth portion 966 of the voltage waveform. The negative voltage ramp along fourth portion 966 may be established to maintain the substrate voltage by compensating for ions that impact the substrate.

Thus, S1 momentarily connects and then disconnects the first voltage, V1, to output 810 through first inductive element L1, and after a period of time, S2 connects and then disconnects the second voltage (e.g., ground) to output 810 through first inductive element L1. Third voltage V3, is coupled to output 810 through second inductive element L2. In this implementation, first voltage V1 may be higher than third voltage V3, and the momentary connection and disconnection of first voltage V1 to output 810 causes the voltage at output 810 to increase along first portion 960 of the voltage waveform to first voltage level Va, and first voltage level Va is sustained along second portion 962 of the waveform. First voltage level Va may be above first voltage V1, and second voltage V2 (e.g., ground) may be less than first voltage level Va. The momentary connecting and then disconnecting of second voltage V2 causes the voltage at output 810 to decrease at third portion 964 to second voltage level Vb that is below second voltage V2 (e.g., ground).

Figure 10:
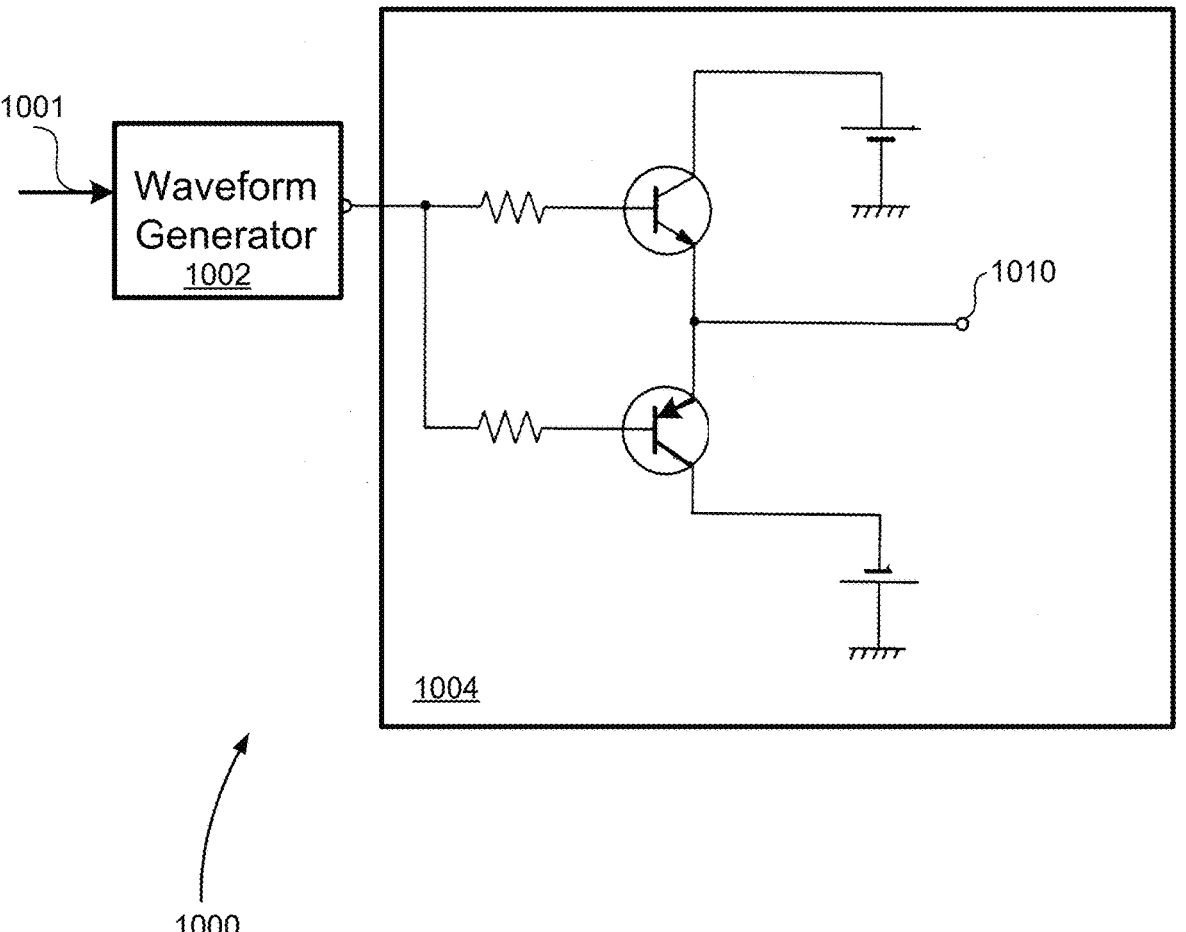
FIG. 10 is a block diagram of another example bias supply that may be used to implement bias supply of the disclosure.

FIG. 10 is a block diagram of another example bias supply 1000 that may be used to implement bias supply of the disclosure. Bias supply 1000 includes a waveform generator 1002 and linear power amplifier 1004. Waveform generator 1002 may be a programmable arbitrary waveform generator configured to produce a low voltage version of the asymmetric periodic voltage waveform in response to a signal from a controller and/or sensor. For instance, a controller (e.g., controller 552) may provide a control signal 1001 to waveform generator 1002 to control the ramp voltage based upon the impedance indicator. For example, controller 552 may control waveform generator 1002 to adjust the slope of the ramp voltage to induce the impedance indicator to be constant, or approximately constant, during the application of the ramp voltage. Linear amplifier 1004 may comprise a class b amplifier or similar device that amplifies the low voltage asymmetric periodic voltage waveform from the waveform generator to produce the asymmetric periodic voltage waveform (e.g., $V_{out}$) at output 1010.

The various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Figure 11:
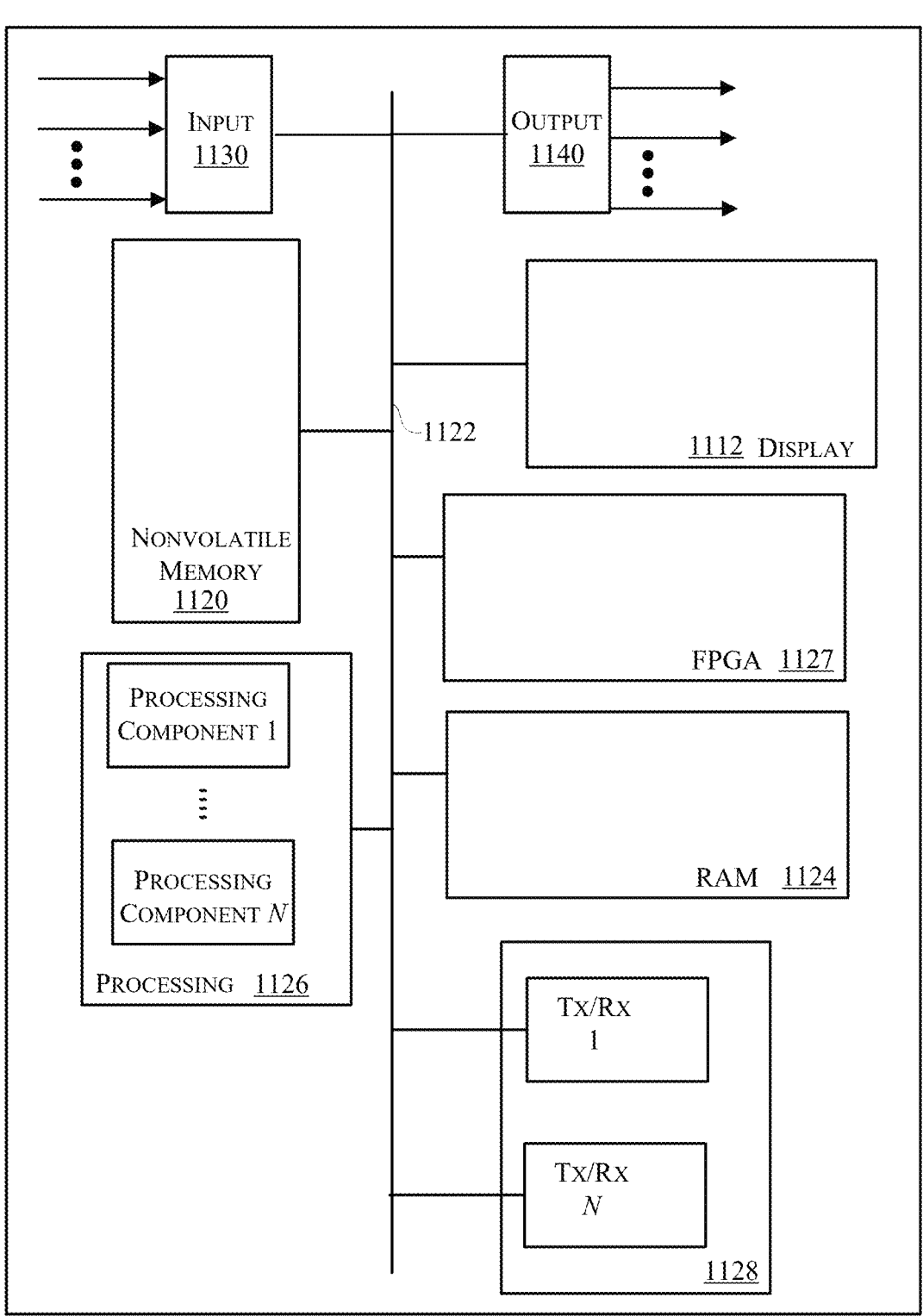
FIG. 11 is a block diagram depicting physical components of a controller that may be utilized to realize control aspects disclosed herein.

Many embodiments and methods described herein may be realized using a processor in connection with processor executable instructions (stored in a computer-readable storage medium) and a field programmable gate array (programmed by hardware description language instructions). In some embodiments, the FPGA is used for high-speed processing and control, comprising switching control, measurement, pulsing, and multi-level operation while a processor is utilized for other lower-speed processing. Referring to FIG. 11 for example, shown is a block diagram depicting physical components of a controller that may be utilized to realize control aspects disclosed herein.

As shown, in this embodiment a display 1112 and nonvolatile memory 1120 are coupled to a bus 1122 that is also coupled to random access memory ("RAM") 1124, a processing portion (which includes N processing components) 1126, a field programmable gate array (FPGA) 1127, and a transceiver component 1128 that includes N transceivers. Although the components depicted in FIG. 11 represent physical components, FIG. 11 is not intended to be a detailed hardware diagram; thus, many of the components depicted in FIG. 11 may be realized by common constructs or distributed among additional physical components. Moreover, it is contemplated that other existing and yet-to-be developed physical components and architectures may be utilized to implement the functional components described with reference to FIG. 11.

This display 1112 generally operates to provide a user interface for a user, and in several implementations the display is realized by a touchscreen display. In general, the nonvolatile memory 1120 is non-transitory memory that functions to store (e.g., persistently store) data and processor-executable code (comprising executable code that is associated with effectuating the methods described herein). In some embodiments for example, the nonvolatile memory 1120 includes bootloader code, operating system code, file system code, and non-transitory processor-executable code to facilitate the execution of a method or functions described herein for controlling a bias power based on plasma impedance. Alternatively or additionally, nonvolatile memory

1120 may receive and store thresholds or instructions for processing/extracting impedance indicators for feedback control.

In many implementations, the nonvolatile memory 1120 is realized by flash memory (e.g., NAND or ONENAND memory), but it is contemplated that other memory types may be utilized as well. Although it may be possible to execute the code from the nonvolatile memory 1120, the executable code in the nonvolatile memory is typically loaded into RAM 1124 and executed by one or more of the N processing components in the processing portion 1126. The N processing components in connection with RAM 1124 generally operate to execute the instructions stored in nonvolatile memory 1120 to enable execution of the algorithms and functions disclosed herein. It should be recognized that several algorithms or functions are disclosed herein, but some of these algorithms or functions are not represented in flowcharts. Processor-executable code to effectuate methods described herein may be persistently stored in nonvolatile memory 1120 and executed by the N processing components in connection with RAM 1124. As one of ordinarily skill in the art will appreciate, the processing portion 1126 may include a video processor, digital signal processor (DSP), micro-controller, graphics processing unit (GPU), or other hardware processing components or combinations of hardware and software processing components (e.g., an FPGA or an FPGA comprising digital logic processing portions). In addition, or in the alternative, non-transitory FPGA-configuration-instructions may be persistently stored in nonvolatile memory 1120 and accessed (e.g., during boot up) to configure a field programmable gate array (FPGA) to implement the algorithms disclosed herein.

The input component 1130 may receive impedance related signals (e.g., signals indicative of plasma impedance) such as the impedance indicator 122. The input component 1130 may also receive the waveform information via the communication line 107. Although not required, in some implementations the FPGA 1127 may be used to realize sampling-related components and the FPGA 1127 may sample the impedance related signals and provide digital representations. In some embodiments, the processing portion 1126 (in connection with processor-executable instructions stored in the nonvolatile memory 1120) is used to realize the controllers disclosed herein, and functions of the controller may reside in a bias supply and/or other components of a plasma processing system. But the FPGA 1127 may also be used to implement these functions. In addition, the input component 1130 may receive phase information and/or a synchronization signal between bias supplies and source generator 102 that are indicative of one or more aspects of an environment within a plasma processing chamber and/or synchronized control between a source generator and the bias supply (e.g., a single switch, dual switch bias supply). The signals received at the input component 1130 may include, for example, synchronization signals, impedance control signals, or control signals from a user interface (e.g., thresholds or instructions for filtering impedance indicator values for feedback control).

The output component 1140 generally operates to provide one or more analog or digital signals to effectuate the gate drive signals for opening and closing of the switches. The output component 1140 may also control one or more aspects of the power supplies described herein. The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (comprising firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

What is claimed is:

1. A system comprising:
   a generator to provide a first waveform; and
   a controller configured to:
      receive a signal indicative of power reflected to the generator;
      receive timing information from a bias supply, wherein the timing information is indicative of when a ramp of a bias waveform of the bias supply is occurring; and
      provide a report indicative of the power reflected to the generator during the ramp of the bias waveform based upon the timing information.

2. The system of claim 1 further comprising at least one sensor to provide the signal indicative of the power reflected to the generator.

3. The system of claim 1 wherein the controller comprises an input port to receive the signal indicative of the power reflected to the generator from an external sensor.

4. The system of claim 1 wherein the signal indicative of the power reflected to the generator comprises a measured parameter indicative of a plasma impedance presented to the generator via a match network.

5. The system of claim 1, wherein the generator comprises a radio frequency amplifier and the controller comprises a processor and a non-transitory computer-readable storage medium comprising instructions embodied thereon, the instructions are executable by the processor, and the instructions comprise instructions for adjusting the first waveform applied by the radio frequency amplifier based upon the signal indicative of the power reflected to the generator while a ramp voltage provided by the bias supply is occurring or providing the report of the power reflected to the generator while the ramp voltage is occurring.

6. The system of claim 1, wherein:
   the signal indicative of the power reflected to the generator comprises one or more of:
      a measured magnitude of plasma impedance;
      a measured reflection coefficient of power reflected;
      a measured voltage standing wave ratio (VSWR);
      a measured forward power;
      a measured delivered power;
      a measured voltage;
      a measured current; and
      a measured phase.

7. A system comprising:
   a bias supply configured to apply a bias waveform, the bias waveform comprising a peak voltage and a ramp voltage;
   a generator to apply a first waveform; and
   at least one controller configured to:

receive an impedance indicator indicative of an impedance coupled to the generator;

receive timing information from the bias supply, wherein the timing information is indicative of when a ramp of a bias waveform of the bias supply is occurring; and provide a report of the impedance during the ramp of the bias waveform based upon the timing information.

8. The system of claim 7 wherein:

the at least one controller is configured to direct the bias supply to adjust a slope of the ramp voltage of the bias waveform to induce the impedance coupled to the generator to be constant, or approximately constant, during an application of the ramp voltage.

9. The system of claim 7, wherein:

the at least one controller is configured to determine a non-fluctuating portion of the impedance indicator and to direct the generator to control the non-fluctuating portion to be constant, or approximately constant, during an application of the ramp voltage of the bias waveform.

10. The system of claim 7, wherein:

the at least one controller is further configured to extract a non-fluctuating portion of the impedance indicator.

11. The system of claim 7, wherein:

the at least one controller is further configured to direct the bias supply to control a duration of the ramp voltage based on the impedance indicator.

12. The system of claim 7, wherein:

the impedance indicator comprises one or more of:

a measured magnitude of plasma impedance;

a measured reflection coefficient of power reflected;

a measured voltage standing wave ratio (VSWR);

a measured forward power;

a measured delivered power;

a measured voltage;

a measured current; and a measured phase.

13. The system of claim 7 wherein the bias supply is further configured to provide an asymmetric periodic voltage waveform, comprising:

a first section that begins with a first negative voltage, followed by an increase to the peak voltage, followed by a decrease to a second negative voltage; and a second section that begins with the second negative voltage and includes the ramp voltage between the second negative voltage and a third negative voltage.

14. A non-transitory computer-readable storage medium comprising instructions embodied thereon, wherein the instructions are executable by a processor and/or capable of programming a field programmable gate array, the instructions comprising instructions for:

providing a bias waveform with a bias supply, wherein the bias waveform includes a peak voltage and a ramp voltage;

applying radio frequency power with a source generator;

receiving a signal indicative of power reflected to the source generator;

receiving timing information from the bias supply, wherein the timing information is indicative of when the ramp voltage is occurring;

obtaining, using the timing information, a measure of the power reflected to the source generator while the ramp voltage is occurring; and controlling the radio frequency power based upon the measure of the power reflected to the source generator while the ramp voltage is occurring.

15. The non-transitory computer-readable storage medium of claim 14 wherein the instructions comprise instructions to provide a report of the power reflected to the source generator while the ramp voltage is occurring.

16. The non-transitory computer-readable storage medium of claim 14 wherein the instructions comprise instructions to provide a report of the power reflected to the source generator based on measurements over an entire cycle of the bias waveform.

17. The non-transitory computer-readable storage medium of claim 14 wherein the instructions comprise instructions to control the ramp voltage of the bias waveform based on the power reflected to the source generator.

18. The non-transitory computer-readable storage medium of claim 14, wherein the power reflected to the source generator is a measured parameter indicative of a plasma impedance presented to the source generator; and the power reflected to the source generator is measured during application of the ramp voltage.

19. The non-transitory computer-readable storage medium of claim 14, wherein the instructions comprise instructions for:

adjusting a slope of the ramp voltage to induce the power reflected to the source generator to be constant, or approximately constant, during an application of the ramp voltage.

20. The non-transitory computer-readable storage medium of claim 14, wherein the instructions comprise instructions for:

extracting a non-fluctuating portion of the power reflected to the source generator corresponding with an application of the ramp voltage; and adjusting a slope of the ramp voltage to induce the non-fluctuating portion of the power reflected to the source generator to be constant, or approximately constant, during an application of the ramp voltage.

* * * * *